United States Patent
Hsieh et al.

(10) Patent No.: US 6,972,617 B2
(45) Date of Patent: Dec. 6, 2005

(54) FM DEMODULATOR INCLUDING A DC OFFSET DETECTOR

(75) Inventors: Hui-Chun Hsieh, Tainan Hsien (TW); Te-Chih Chang, Hsin-Chu (TW)

(73) Assignee: AMIC Technology Corporation, Hsin-Chu (TW)

( * ) Notice: Subject to any disclaimer, the term of this patent is extended or adjusted under 35 U.S.C. 154(b) by 52 days.

(21) Appl. No.: 10/708,987

(22) Filed: Apr. 6, 2004

(65) Prior Publication Data

US 2005/0093621 A1     May 5, 2005

(30) Foreign Application Priority Data

Nov. 3, 2003 (TW) ............................... 92130607 A

(51) Int. Cl.[7] ............................................. H03D 3/14
(52) U.S. Cl. ...................... 329/315; 329/318; 329/320; 375/345; 455/226.1; 455/226.2
(58) Field of Search ................................ 329/315, 318, 329/320; 455/226.1, 226.2; 375/345

(56) References Cited

U.S. PATENT DOCUMENTS 4,272,726 A * 6/1981 Malchow ..................... 329/337
4,479,253 A * 10/1984 Daniel, Jr. ................ 455/226.2

* cited by examiner

*Primary Examiner*—Arnold Kinkead
(74) *Attorney, Agent, or Firm*—Winston Hsu

(57) ABSTRACT

An FM demodulator has a differential output demodulator for receiving an FM signal and for outputting a positive differential signal and a negative differential signal of a demodulated signal of the FM signal, a DC offset detector electrically connected to the differential output demodulator for generating a DC offset signal according to peak signals of the positive differential signal and the negative differential signal, and a correction circuit electrically connected to the differential output demodulator and the DC offset detector to compensate for the demodulated signal according to the DC offset signal.

7 Claims, 7 Drawing Sheets

FM DEMODULATOR INCLUDING A DC OFFSET DETECTOR

BACKGROUND OF INVENTION

1. Field of the Invention

The present invention relates to an FM demodulator, and more particularly, to an FM demodulator including a DC offset detector.

2. Description of the Prior Art

Please refer to FIG. 1. FIG. 1 is a schematic diagram of a conventional FM demodulator 10. The FM demodulator 10 includes a delay circuit 12, a multiplying circuit 14, a low pass filter 16, and a comparator 18. An input signal is firstly processed by the delay circuit 12 to obtain a delay signal of a 90 degrees delayed phase. The input signal is then multiplied by the delay signal by the multiplying circuit 14 for obtaining a product signal. The amplitude of the product signal is proportional to the amplitude of the input signal as well as the angular frequency of the input signal (intermediate frequency plus frequency deviation). If the input signal is held to a constant amplitude by means of automatic gain control (AGC) or use of a hard limiter, the product signal will have an amplitude proportional to the frequency deviation. The product signal is thereafter passed through the low pass filter 16 to remove signal components at intermediate frequency and multiple frequency so as to obtain a demodulated signal. The demodulated signal is finally delivered to the comparator 18 for obtaining a pulse signal.

The conventional FM demodulator 10 requires accurate delay elements and filters with accurately controlled phase characteristics to generate the delay signal of an approximate 90 degrees delayed phase. Otherwise, excessive DC offsets will occur. Another source of DC offsets is reference oscillator inaccuracies which result in the intermediate frequency being offset from its nominal value. Since the comparator 18 converts the demodulated signal into the pulse signal according to the DC voltage of the demodulated signal, DC offsets disable the comparator 18 from generating an accurate pulse signal.

There are two methods in the art to solve DC offset problems. The first method is to use an RC filter for obtaining the DC voltage of the FM signal, while the second method is to detect the positive peak signal and the negative peak signal of the FM signal for obtaining the DC voltage. The first method requires a capacitor with higher capacity for obtaining a preferable DC voltage. Since the high capacity capacitor needs longer time to recharge, the speed is slower. In addition, the high capacity capacitor cannot be integrated into IC chips, but has to be connected externally. Though use of a smaller capacitor can improve the speed, the DC voltage generated by the smaller capacitor, however, is not favorable. On the other hand, the second method encounters mismatch problems. For example, if the positive peak detector is composed of PMOS components while the negative value detector is composed of NMOS components, errors of the DC voltage measured by the peak detectors will occur due to the dissimilar characteristics of PMOS components and NMOS components.

SUMMARY OF INVENTION

It is therefore a primary objective of the present invention to provide an FM demodulator including a DC offset detector to solve the above problems.

According to the claimed invention, an FM demodulator is disclosed. The FM demodulator includes a differential output demodulator for receiving an FM signal, and for outputting a positive differential signal and a negative differential signal of a demodulated signal of the FM signal, a DC offset detector electrically connected to the differential output demodulator for generating a DC offset signal according to peak signals of the positive differential signal and the negative differential signal, a correction circuit electrically connected to the differential output demodulator and the DC offset detector to compensate for the demodulated signal according to the DC offset signal, and a received signal strength indicator (RSSI) electrically connected to the DC offset detector for switching on and switching off the DC offset detector depending on the strength of the demodulated signal.

The DC offset detector includes a first peak detector for measuring a peak signal of the positive differential signal, a second peak detector for measuring a peak signal of the negative differential signal, and a calculation circuit connected to the first peak detector and the second peak detector for generating the DC offset signal according to the peak signals measured by the first peak detector and the second peak detector.

In a first embodiment, the calculation circuit is a subtraction circuit for subtracting the peak signal of the second peak detector from the peak signal of the first peak detector for measuring the DC offset signal (a differential offset signal).

In a second embodiment, the calculation circuit includes a subtraction circuit and a dividing circuit. The subtraction circuit subtracts the peak signal of the second peak detector from the peak signal of the first peak detector. The dividing circuit is connected to the subtraction circuit and divides the output signal of the subtraction circuit by two for obtaining the DC offset signal (a single ended offset signal).

According to a third embodiment, the calculation circuit includes an addition circuit, a dividing circuit, and a subtraction circuit. The addition circuit adds the peak signal of the first peak detector and the peak signal of the second peak detector together. The dividing circuit connected to the addition circuit divides the output signal of the addition circuit by two. The subtraction circuit connected to the dividing circuit then subtracts the output signal of the dividing circuit from the peak signal of the first peak detector so that the DC offset signal (a single ended offset signal) is obtained.

These and other objectives of the present invention will no doubt become obvious to those of ordinary skill in the art after having read the following detailed description of the preferred embodiment that is illustrated in the various figures and drawings.

DETAILED DESCRIPTION

Figure 1:
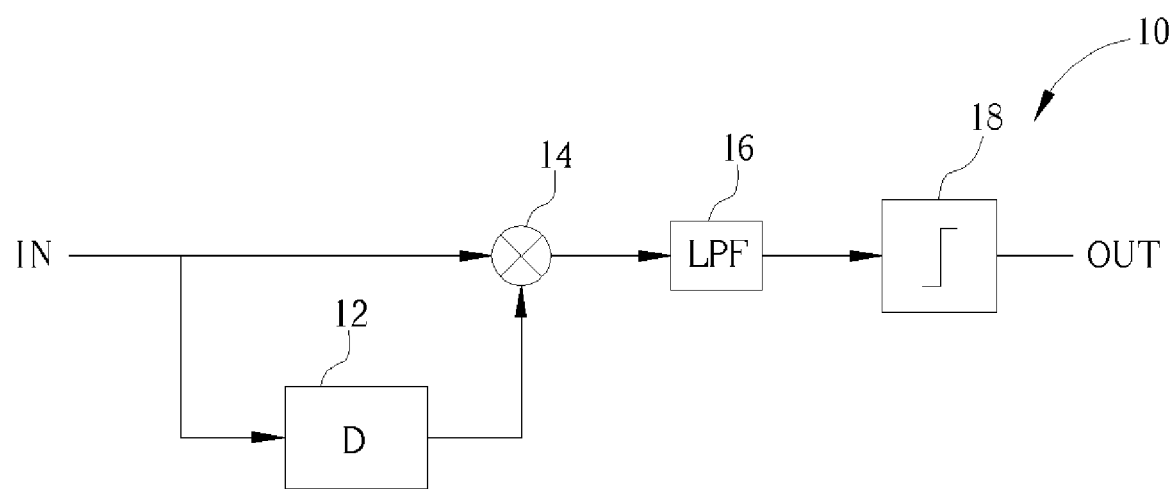
FIG. 1 is a schematic diagram of a conventional FM demodulator.
Figure 2:
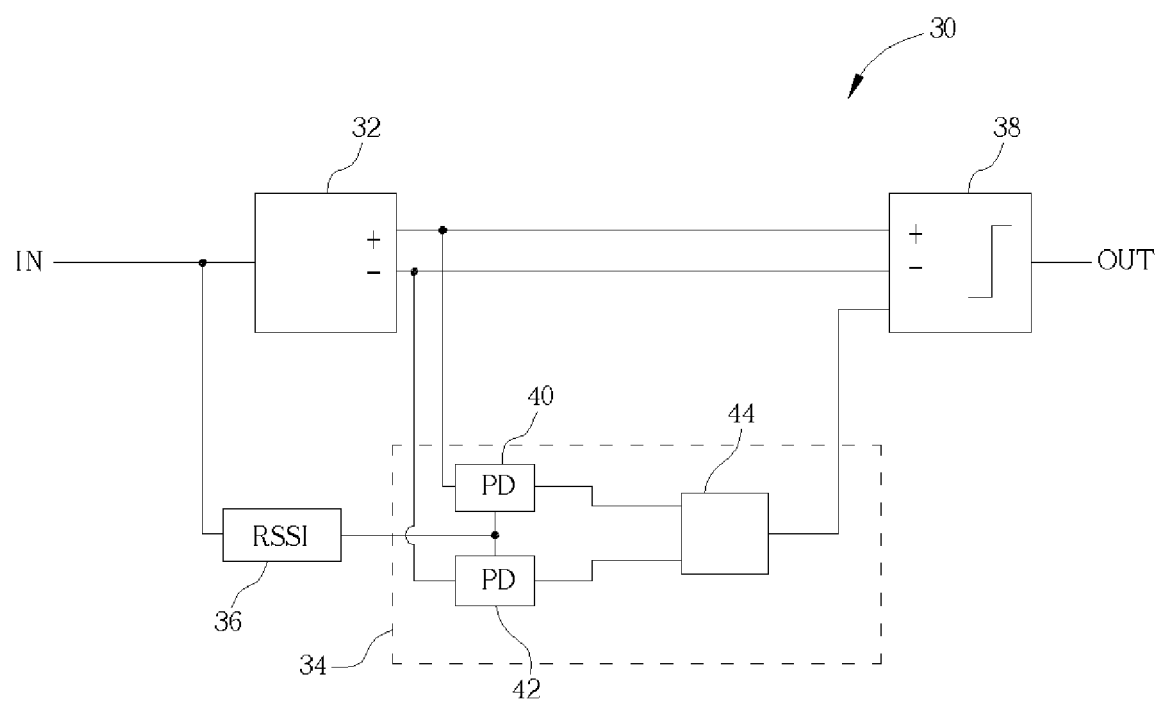
FIG. 2 is a schematic diagram of an FM demodulator of the present invention.

Please refer to FIG. 2. FIG. 2 is a schematic diagram of an FM demodulator 30 of the present invention. As shown in FIG. 2, the FM demodulator 30 includes a differential output demodulator 32, a DC offset detector 34, a received signal strength indicator (RSSI) 36, and a correction circuit 38. The differential output demodulator 32 receives an FM signal, and outputs a positive differential signal and a negative differential signal of the demodulated signal of the FM signal. The DC offset detector 34 is electrically connected to the differential output demodulator 32, and generates a DC offset signal according to the positive differential signal and the negative differential signal so as to compensate for the demodulated signal. The DC offset detector 34 includes a first peak detector 40, a second peak detector 42, and a calculation circuit 44. The first peak detector 40 receives the positive differential signal and measures a peak signal of the positive differential signal, while the second peak detector 42 receives the negative differential signal and measures a peak signal of the negative differential signal. It is noted that the peak signal measured by the first peak detector 40 and the peak signal measured by the second peak detector 42 are inphase. In other words, the first peak detector 40 measures the positive peak signal of the positive differential signal and the second peak detector 42 measures the positive peak signal of the negative differential signal, or the first peak detector 40 measures the negative peak signal of the positive differential signal and the second peak detector 42 measures the negative peak signal of the negative differential signal. In such case the first peak detector 40 and the second peak detector 42 can be made of the same components, such as PMOS components or NMOS components. Consequently, errors due to component mismatch will not occur. The calculation circuit 44 is connected to the first peak detector 40 and the second peak detector 42 for generating the DC offset signal in accordance with the peak signals of the first peak detector 40 and the second peak detector 42.

Figure 3:
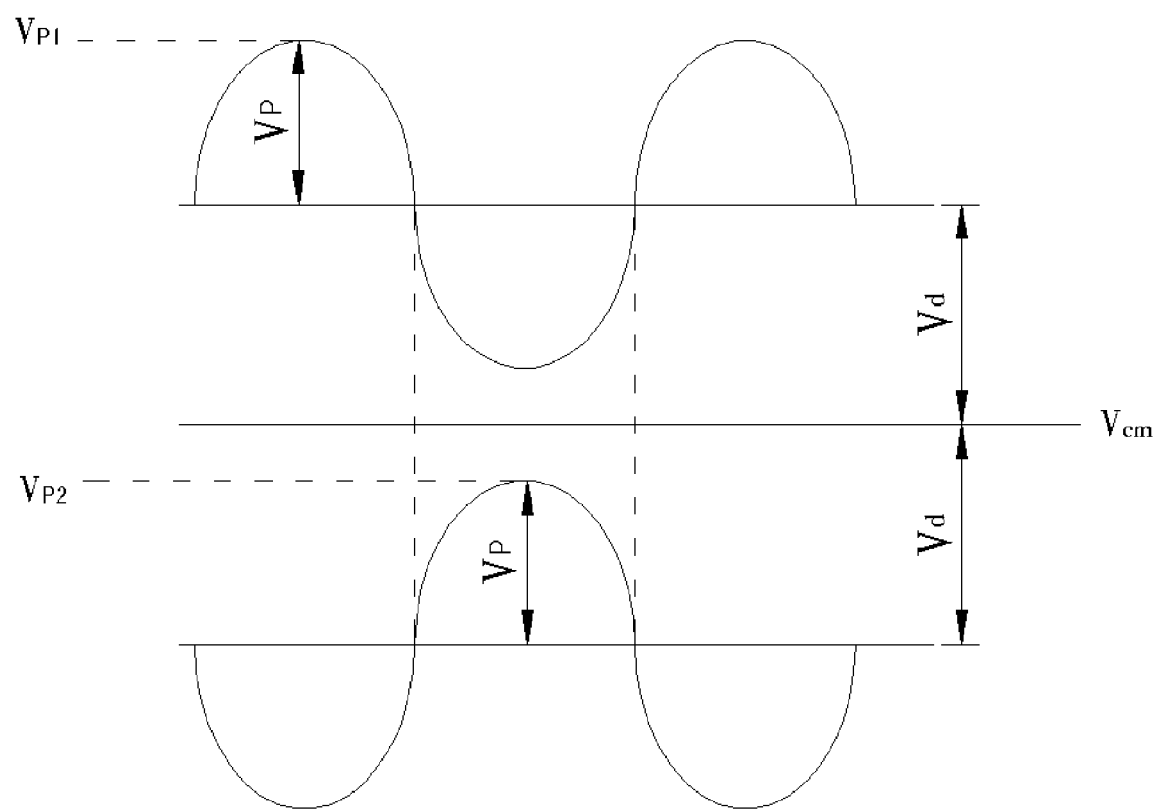
FIG. 3 is a waveform diagram of the positive differential signal and the negative differential signal.

The RSSI 36, electrically connected to the DC offset detector 34, detects the strength of the FM signal received by the differential output demodulator 32 so as to switch on and switch off the DC offset detector 34. The correction circuit 38 is electrically connected to the differential output demodulator 32 and the DC offset detector 34, and compensates for the demodulated signal generated by the differential output demodulator 32 according to the DC offset signal generated by the DC offset detector 34. Please refer to FIG. 3. FIG. 3 is a waveform diagram of the positive differential signal and the negative differential signal, where Vp1 represents the positive peak signal of the positive differential signal, Vp2 represents the positive peak signal of the negative differential signal, Vp represents the deviation from the peak signal to the DC portion of the positive (or negative) differential signal, Vcm represents an ideal DC voltage, and Vd represents the offset of DC portion of the positive (or negative) differential signal with respect to the ideal DC voltage. Vp1 and Vp2 can be described as:

$$Vp1 = Vcm + Vd + Vp \qquad \text{Eq.1}$$

$$Vp2 = Vcm - Vd + Vp \qquad \text{Eq.2}$$

Subtracting Eq.2 from Eq.1 obtains $$(Vp1 - Vp2) = 2Vd \qquad \text{Eq.3}$$

where 2Vd is referred to as differential offset voltage, and Vd is referred to as single ended offset voltage. In addition, Vd can be obtained by the following three calculations:

$$1. Vd = (Vp1 - Vp2)/2 \qquad \text{Eq.4}$$

$$2. Vd = (Vp1)/2 - (Vp2)/2 \qquad \text{Eq.5}$$

$$3. Vd = Vp1 - (Vp1 + Vp2)/2 \qquad \text{Eq.6}$$

Figure 4:
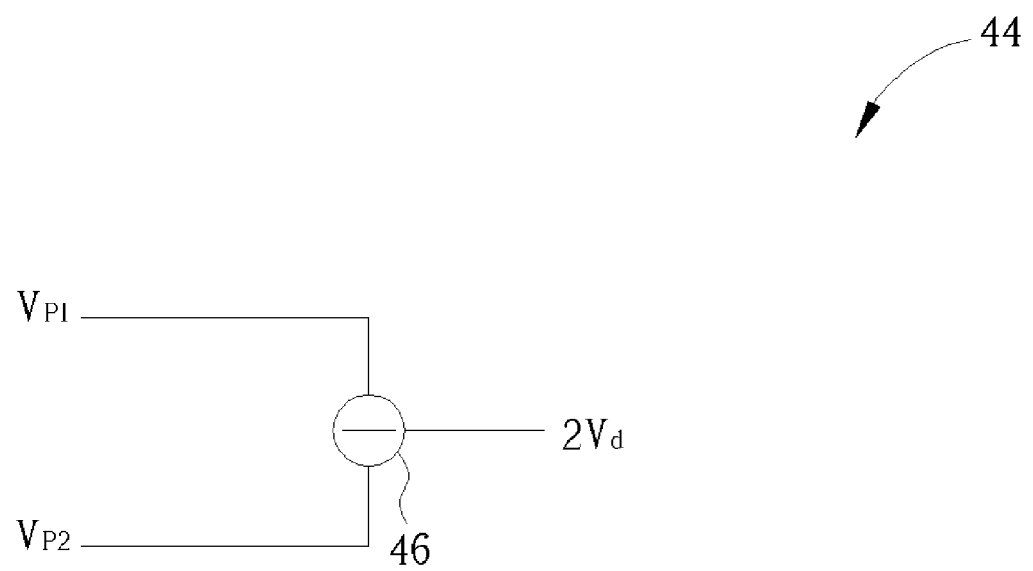
FIG. 4 to FIG. 6 are schematic diagrams respectively illustrating three embodiments of the calculation circuit shown in FIG. 2.
Figure 5:
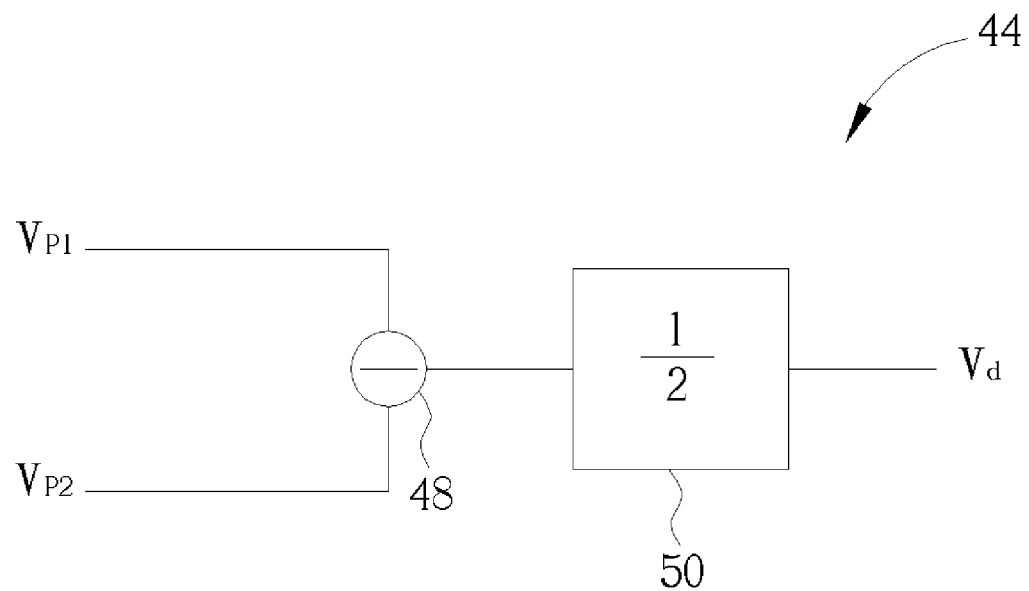
Figure 6:
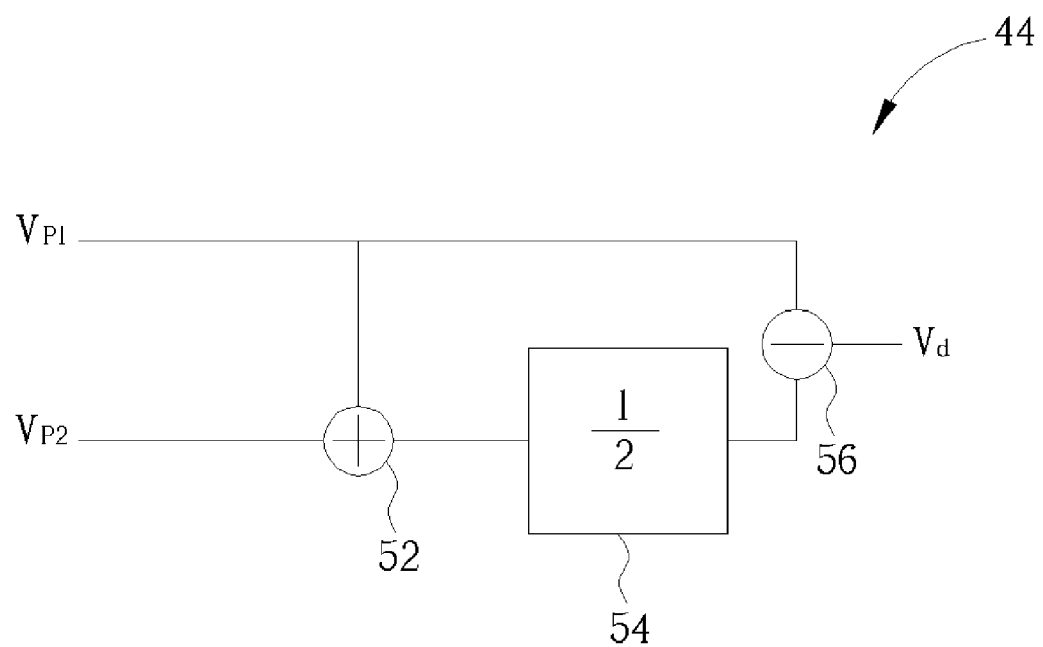

Please refer to FIG. 4 to FIG. 6. FIG. 4 to FIG. 6 are schematic diagrams respectively illustrating three embodiments of the calculation circuit 44 shown in FIG. 2. As shown in FIG. 4, the calculation circuit 44 is a subtraction circuit 46. The peak signal Vp2 measured by the second peak detector 42 is subtracted from the peak signal Vp1 measured by the first peak detector 40 by the subtraction circuit 46, and thereby generating the DC offset signal 2Vd (with reference to Eq.3). Accordingly, the correction circuit 38 compensates for the demodulated signal according to 2Vd. As shown in FIG. 5, the calculation circuit 44 includes a subtraction circuit 48 and a dividing circuit 50. The peak signal Vp2 measured by the second peak detector 42 is subtracted from the peak signal Vp1 measured by the first peak detector 40 by the subtraction circuit 48. Then the output signal of the subtraction circuit 48 is divided by two by the dividing circuit 50 for generating the DC offset signal Vd (with reference to Eq.4), so that the correction circuit 38 compensates for the demodulated signal according to Vd. As shown in FIG. 6, the calculation circuit 44 includes an addition circuit 52, a dividing circuit 54, and a subtraction circuit 56. The peak signal Vp1 measured by the first peak detector 40 and the peak signal Vp2 measured by the second peak detector 42 are added together by the addition circuit 52. Then the output signal of the addition circuit 52 is divided by two by the dividing circuit 54. Finally the output signal of the dividing circuit 54 is subtracted from the peak signal Vp1 measured by the first peak detector 40 for generating the DC offset signal Vd (with reference to Eq.6), so that the correction circuit 38 compensates for the demodulated signal according to Vd.

Figure 7:
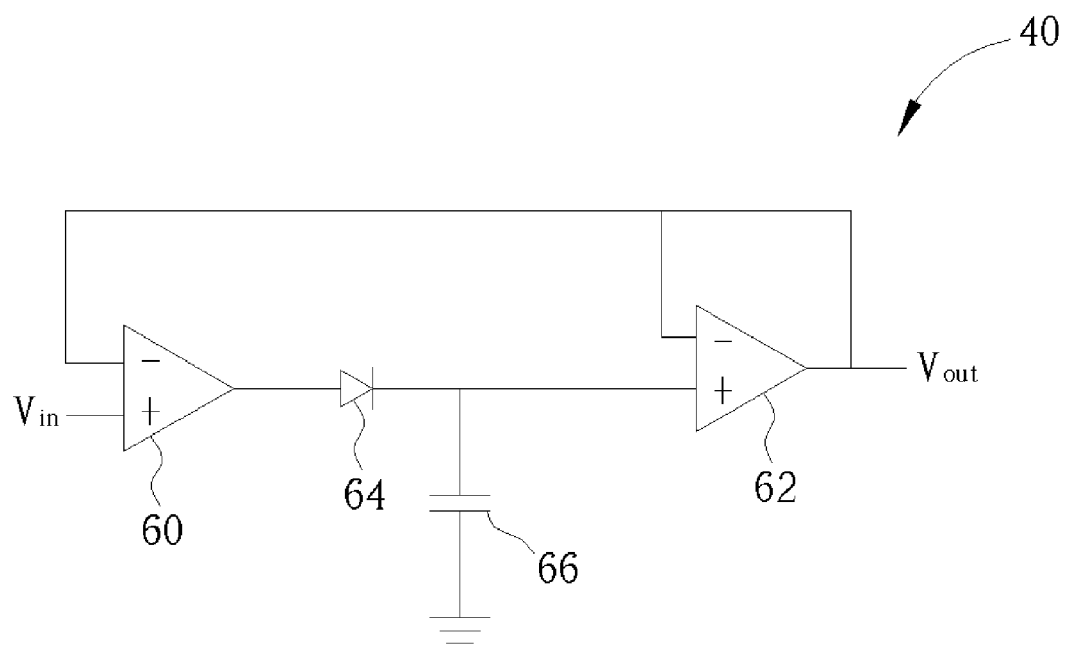
FIG. 7 is a schematic diagram of the first peak detector shown in FIG. 2.

Please refer to FIG. 7. FIG. 7 is a schematic diagram of the first peak detector 40 shown in FIG. 2. As shown in FIG. 7, the first peak detector 40 includes a first amplifier 60, a second amplifier 62, a diode 64, and a capacitor 66. The positive input end of the first amplifier 60 is the input end of the first peak detector 40, and the output end of the second amplifier 62 is connected to both the negative input ends of the first amplifier 60 and the second amplifier 62 to form a negative feedback loop. The diode 64 is connected to the output end of the first amplifier 60 and the positive input end of the second amplifier 62, and the capacitor is connected to the positive input end of the second amplifier 62 at one end, and grounded at the other end. When the input voltage of the first peak detector 40 is larger than its output voltage, the first amplifier 60 and the diode 64 are conducted and thereby recharge the capacitor 66. Meanwhile the input voltage and the output voltage of the first peak detector 40 are equal. When the input voltage of the first peak detector 40 is larger than its output voltage, the first amplifier 60 forces the diode 64 being conducted, and thereby recharge the capacitor 66. Meanwhile the input voltage and the output voltage of the first peak detector 40 are equal. When the input voltage of the first peak detector 40 is smaller than its output voltage, the output voltage of the first amplifier 60 is smaller than the voltage of the capacitor 66. Accordingly, the diode 64 is off, and the voltage on the capacitor 66 is held and this maintains the output voltage of the first peak detector 40. Since the first peak detector 40 has to be kept at the peak voltage over a long period of time, the second amplifier 62 serves as a buffer of the capacitor 66. It is noted that the first peak detector 40 and the second peak detector 42 have identical structures and functions, and detect inphase peak signals. Therefore, the first peak detector 40 and the second peak detector 42 are composed of the same components, and errors due to component mismatch are prevented.

It can be seen that the differential output demodulator 32 generates the positive differential signal and the negative differential of the demodulated signal of the FM signal. Then the DC offset detector 34 calculates the DC offset signal according to the inphase peak signals of the positive differential signal and the negative differential signal. Finally, the correction circuit 38 compensates for the demodulated signal according to the DC offset signal generated by the DC offset detector 34 and the positive differential signal and the negative differential signal generated by the differential output demodulator 32.

In comparison with the prior art, the FM demodulator of the present invention uses the DC offset detector to detect inphase peak signals of the positive differential signal and the negative differential signal for executing DC offset compensation. Since the two peak signals respectively measured by the first peak detector and the second peak detector are inphase, the first peak detector and the second peak detector can be composed of identical components. On the other hand, the prior art peak detectors have to detect the positive peak signal and the negative peak signal of the same signal, and thus must be composed of different components. This generates errors due to component mismatch. Conclusively, the present invention corrects this disadvantage without adding the cost of the DC offset detector.

Those skilled in the art will readily appreciate that numerous modifications and alterations of the FM demodulator may be made without departing from the scope of the present invention. Accordingly, the above disclosure should be construed as limited only by the metes and bounds of the appended claims.

What is claimed is:

1. An FM demodulator comprising:
    a differential output demodulator for receiving an FM signal, and for outputting a positive differential signal and a negative differential signal of a demodulated signal of the FM signal;
    a DC offset detector electrically connected to the differential output demodulator, the DC offset detector comprising:
    a first peak detector for measuring a peak signal of the positive differential signal;
    a second peak detector for measuring a peak signal of the negative differential signal; and
    a calculation circuit connected to the first peak detector and the second peak detector for generating a DC offset signal according to the peak signals measured by the first peak detector and the second peak detector; and
    a correction circuit electrically connected to the differential output demodulator and the DC offset detector to compensate for the demodulated signal according to the DC offset signal generated by the calculation circuit.

2. The FM demodulator of claim 1 wherein peak measurements of the positive differential signal and the negative differential signal are inphase.

3. The FM demodulator of claim 1 wherein the calculation circuit is a subtraction circuit, and the DC offset signal is a differential offset signal.

4. The FM demodulator of claim 1 wherein the DC offset signal is a single ended offset signal.

5. The FM demodulator of claim 4 wherein the calculation circuit comprises:
    a subtraction circuit for subtracting the peak signal generated by the second peak detector from the peak signal generated by the first peak detector; and
    a dividing circuit connected to the subtraction circuit for obtaining the DC offset signal by dividing an output signal of the subtraction circuit by two.

6. The FM demodulator of claim 4 wherein the calculation circuit comprises:
    an addition circuit for adding the peak signal of the first peak detector and the peak signal of the second peak signal together;
    a dividing circuit connected to the addition circuit for dividing an output signal of the addition circuit by two; and
    a subtraction circuit connected to the dividing circuit to subtract an output signal of the dividing circuit from the peak signal of the first peak detector for obtaining the DC offset signal.

7. The FM demodulator of claim 1 further comprising a received signal strength indicator (RSSI) electrically connected to the DC offset detector for switching on and switching off the DC offset detector depending on the strength of the received FM signal.

* * * * *